United States Patent
Huang

(10) Patent No.: US 10,691,168 B2
(45) Date of Patent: Jun. 23, 2020

(54) MIDDLE FRAME ASSEMBLY, ELECTRONIC APPARATUS AND METHOD FOR MANUFACTURING MIDDLE FRAME ASSEMBLY

(71) Applicant: GUANGDONG OPPO MOBILE TELECOMMUNICATIONS CORP., LTD., Dongguan, Guangdong (CN)

(72) Inventor: Fuyong Huang, Guangdong (CN)

(73) Assignee: GUANGDONG OPPO MOBILE TELECOMMUNICATIONS CORP., LTD., Dongguan, Guangdong (CN)

(*) Notice: Subject to any disclaimer, the term of this patent is extended or adjusted under 35 U.S.C. 154(b) by 43 days.

(21) Appl. No.: 16/203,360

(22) Filed: Nov. 28, 2018

(65) Prior Publication Data
US 2019/0243422 A1 Aug. 8, 2019

(30) Foreign Application Priority Data
Feb. 5, 2018 (CN) .......................... 2018 1 0112888

(51) Int. Cl.
G06F 1/16 (2006.01)
H04M 1/02 (2006.01)
H05K 5/00 (2006.01)

(52) U.S. Cl.
CPC .......... *G06F 1/1633* (2013.01); *G06F 1/1626* (2013.01); *G06F 1/1658* (2013.01);
(Continued)

(58) Field of Classification Search
CPC .... G06F 1/1626; G06F 1/1656; G06F 1/1658; G06F 2200/1633; H04M 1/0249; H04M 1/0252; H04M 1/0283
See application file for complete search history.

(56) References Cited

U.S. PATENT DOCUMENTS 6,532,152 B1* 3/2003 White ............... G02F 1/133308
361/692
8,519,286 B1* 8/2013 Bloch ..................... G06F 3/044
200/302.2
(Continued)

FOREIGN PATENT DOCUMENTS

CN 201185519 Y 1/2009
CN 101766417 A 7/2010
(Continued)

OTHER PUBLICATIONS

International search report for Application No. PCT/CN2018/116392, dated Feb. 19, 2019 (11 pages).
(Continued)

*Primary Examiner* — Adrian S Wilson
(74) *Attorney, Agent, or Firm* — Ladas & Parry LLP

(57) ABSTRACT

A middle frame may include a middle frame and a bearing plate. The middle frame may include a first surface and a second surface opposite to the first surface and defining a first through hole and a second through hole spaced apart from the first through hole, and both the first through hole and the second through hole may penetrate the first surface and the second surface. The bearing plate may include a bearing body having a third surface, a first extending portion extending from the third surface and configured to pass through the first through hole and have an interference fit with the middle frame, and a second extending portion extending from the third surface, spaced apart from the first extending portion and configured to pass through the second through hole and have a clearance fit with the middle frame.

20 Claims, 11 Drawing Sheets

(52) U.S. Cl.
CPC ....... *H04M 1/0202* (2013.01); *H04M 1/0249* (2013.01); *H04M 1/0252* (2013.01); *H05K 5/0086* (2013.01); *G06F 2200/1633* (2013.01)

(56) References Cited

U.S. PATENT DOCUMENTS

| | | | | |
|---|---|---|---|---|
| 9,338,910 | B2* | 5/2016 | Hattori | H04M 1/026 |
| 10,372,166 | B2* | 8/2019 | Gable | H04M 1/18 |
| 2008/0018606 | A1 | 1/2008 | Chen | |
| 2012/0120566 | A1* | 5/2012 | Miao | H04M 1/0249 |
| | | | | 361/679.01 |
| 2013/0133395 | A1 | 5/2013 | Kuo et al. | |
| 2014/0206420 | A1* | 7/2014 | Neichi | H04M 1/0249 |
| | | | | 455/575.8 |
| 2015/0062807 | A1* | 3/2015 | Gwin | G06F 1/1656 |
| | | | | 361/679.55 |
| 2015/0341072 | A1* | 11/2015 | Lai | H04B 1/3888 |
| | | | | 455/575.8 |
| 2017/0196110 | A1* | 7/2017 | Shinn | H05K 5/061 |
| 2019/0036201 | A1* | 1/2019 | Hill | G06F 1/1626 |
| 2019/0246511 | A1* | 8/2019 | Huang | B23P 11/02 |

FOREIGN PATENT DOCUMENTS

| | | |
|---|---|---|
| CN | 201869459 U | 6/2011 |
| CN | 203826736 U | 9/2014 |
| CN | 204206664 U | 3/2015 |
| CN | 204465646 U | 7/2015 |
| CN | 204559655 U | 8/2015 |
| CN | 205071068 U | 3/2016 |
| CN | 205140403 U | 4/2016 |
| CN | 105704954 A | 6/2016 |
| CN | 205490743 U | 8/2016 |
| CN | 106094992 A | 11/2016 |
| CN | 106862399 A | 6/2017 |
| CN | 107322245 A | 11/2017 |
| CN | 107562128 A | 1/2018 |
| CN | 108243587 A | 7/2018 |
| JP | 2002524711 A | 8/2002 |
| JP | 2012227217 A | 11/2012 |

OTHER PUBLICATIONS

China's first review notice for Application No. CN201810112888.6, dated Apr. 17, 2019 (9 pages).
The State Intellectual Property Office of People's Republic of China, Notification to Grant Patent Right for Chinese Patent Application No. 201810112888.6, dated Oct. 9, 2019 (3 pages).
European search report for Application No. EP18208501.9, dated May 29, 2019 (6 pages).
Second Office Action from China patent office in a counterpart Chinese patent Application 201810112888.6, dated Jul. 16, 2019 (11 pages).

* cited by examiner

MIDDLE FRAME ASSEMBLY, ELECTRONIC APPARATUS AND METHOD FOR MANUFACTURING MIDDLE FRAME ASSEMBLY

CROSS REFERENCE TO RELATED APPLICATIONS

This application claims priorities to Chinese Patent Application No. 201810112888.6, filed on Feb. 5, 2018, the contents of which are herein incorporated by reference in their entireties.

TECHNICAL FIELD

The described embodiments relate to mechanical technology, and in particular to a middle frame assembly, an electronic apparatus with the middle frame assembly and a method for manufacturing the middle frame assembly.

BACKGROUND

Middle frame assembly of an electronic apparatus generally includes a middle frame and a bearing plate. In the related art, the middle frame and the bearing plate are usually fixedly connected by welding. However, the welding is a rigid connection, and a stress concentration of the welded portion between the middle frame and the bearing plate is easily caused during the welding process, which may make the appearance of the middle frame and the bearing plate uneven, and thus affecting the performance of electronic apparatus.

BRIEF DESCRIPTION OF THE DRAWINGS

In order to make the technical solution described in the embodiments of the present disclosure more clear, the drawings used for the description of the embodiments will be briefly described. Apparently, the drawings described below are only for illustration but not for limitation. It should be understood that, one skilled in the art may acquire other drawings based on these drawings, without making any inventive work.

DETAILED DESCRIPTION

Figure 1:
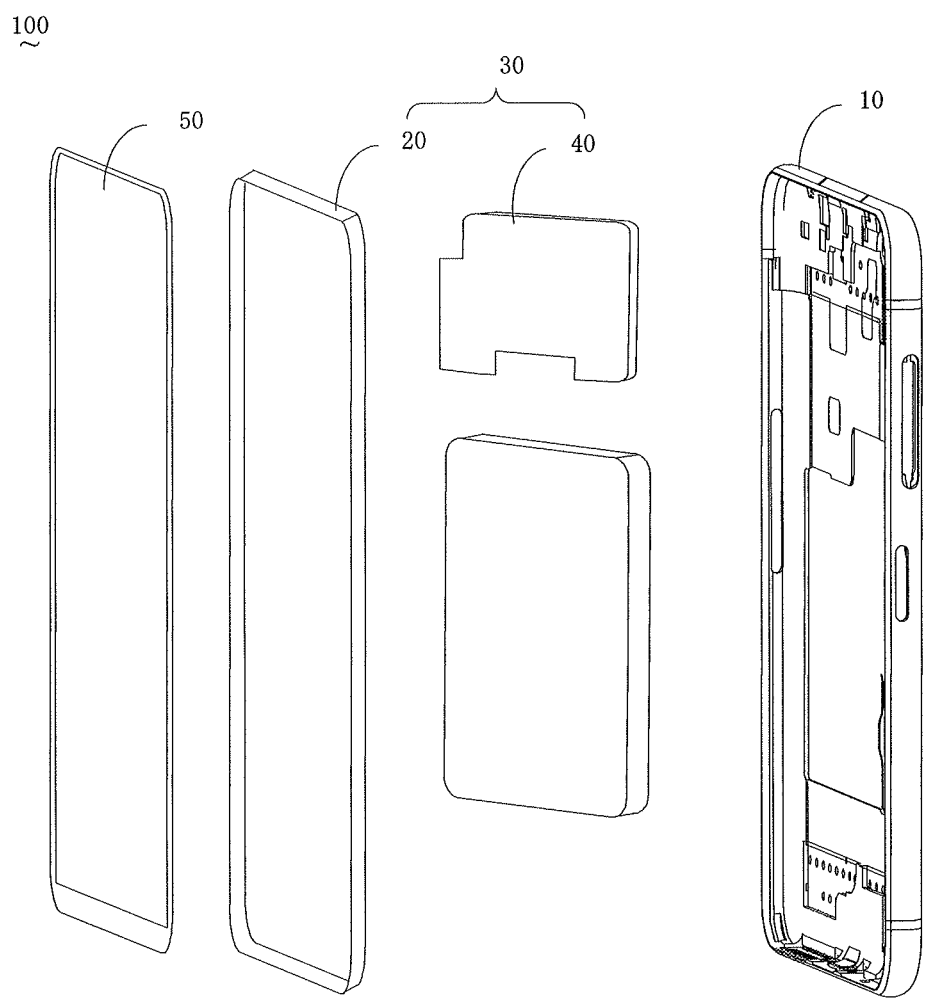
FIG. 1 is an exploded view of the electronic apparatus according to an embodiment of the present disclosure.

In order to more clearly understand the objective, the features and advantages of the present disclosure, the present disclosure will be described in details with reference to the drawings and the embodiments. It should be noted that, the embodiments and the features recited in the embodiments of the present disclosure may be combined with each other without confliction.

Plenty of specific details are described in the embodiments in order to better understand the technical solution of the present disclosure. However, the embodiments described here are only some exemplary embodiments, not all the embodiments. Based on the embodiments described in the present disclosure, one skilled in the art may acquire all other embodiments without any creative work. All these shall be covered within the protection scope of the present disclosure.

In the embodiments of the present disclosure, it is to be understood that terms such as "central", "longitudinal", "lateral", "length", "width", "thickness", "upper", "lower", "front", "rear", "left", "right", "vertical", "horizontal", "top", "bottom", "inner", "outer", "clockwise" and "counterclockwise" refer to the orientations and locational relations illustrated in the drawings, and for describing the present disclosure and for describing in a simple manner, and which are not intended to indicate or imply that the device or the elements are disposed to locate at the specific directions or are structured and performed in the specific directions, which could not to be understood as limiting the present disclosure. In addition, terms such as "first" and "second" are used herein for purposes of description and are not intended to indicate or imply relative importance or significance or to imply the number of indicated technical features. Thus, the feature defined with "first" and "second" may comprise one or more of such a feature. In the description of the present disclosure, "a plurality of" means two or more than two, unless specified otherwise.

In the embodiments of the present disclosure, unless specified or limited otherwise, terms "mounted", "connected," "coupled", "fixed" and the like are used in a broad sense, and may include, for example, fixed connections, detachable connections, or integral connections; may also be mechanical or electrical connections; may also be direct connections or indirect connections via intervening structures; may also be inner communications of two elements, as can be understood by those skilled in the art depending on specific contexts.

In the embodiments of the present disclosure, unless specified or limited otherwise, a structure in which a first feature is "on" or "below" a second feature may encompass an embodiment in which the first feature is in a direct contact with the second feature, and may also encompass an embodiment in which the first feature and the second feature are not in a direct contact, but are contacted via an additional feature provided therebetween. Furthermore, expressions such as a first feature is "on", "above" or "on top of" a second feature may encompass an embodiment in which the first feature is right or obliquely "on", "above" or "on top of" the second feature, or just that the first feature is at a height higher than that of the second feature; while expressions such as a first feature is "below", "under" or "on bottom of" a second feature may encompass an embodiment in which the first feature is right or obliquely "below", "under" or "on bottom of" the second feature, or just that the first feature is at a height lower than that of the second feature.

The following disclosure provides many different embodiments or examples for implementing different structures of the embodiments of the present disclosure. In order to simplify the disclosure of embodiments, the components and settings of the specific examples are described below. Of course, they are merely examples and are not intended to limit the present disclosure. In addition, the embodiments of the present disclosure may repeat reference numerals and/or reference letters in different examples, which are for the purpose of simplicity and clarity, and do not in themselves indicate the relationship between the various embodiments and/or arrangements discussed. Moreover, embodiments of the present disclosure provide examples of various specific processes and materials, but one of ordinary skill in the art will recognize the use of other processes and/or the use of other materials.

References throughout this specification to "an embodiment", "some embodiments", "one embodiment", "another example", "an example", "a specific example" or "some examples" mean that a particular feature, structure, material, or characteristic described in connection with the embodiment or example is included in at least one embodiment or example of the present disclosure. Thus, the appearances of the phrases such as "in some embodiments", "in one embodiment", "in an embodiment", "in another example", "in an example", "in a specific example" or "in some examples" in various places throughout the specification are not necessarily referring to the same embodiment or example of the present disclosure. Furthermore, the particular features, structures, materials, or characteristics may be combined in any suitable manner in one or more embodiments or examples.

In the following, an electronic apparatus 100 provided in embodiments of the present disclosure will be described with reference to drawings.

The electronic apparatus 100 may include intelligent devices such as smartphone, mobile internet device (MID), Ebook, Play Station Portable (PSP), Personal Digital Assistant (PDA) and the like. It should be understood that "electronic apparatus 100" in the present disclosure may include, but be not limited to an apparatus receiving/transmitting communication signals via wired connection, for example, public switched telephone network (PSTN), digital subscriber line (DSL), digital cable, electric cable and/or another data connection/network, and/or cellular network, Wireless Area Networks (WLAN), digital television network such as DVB-H (Digital Video Broadcasting Handheld) network, satellite network, AM-FM broadcast transmitter and/or another communication terminal of wireless interface. The electronic apparatus 100 may also include a satellite or cellular telephone, a personal communication system terminal with cellular radio telephone and data processing, facsimile and data communication, beeper, or other electronic apparatuses with a transceiver.

Figure 2:
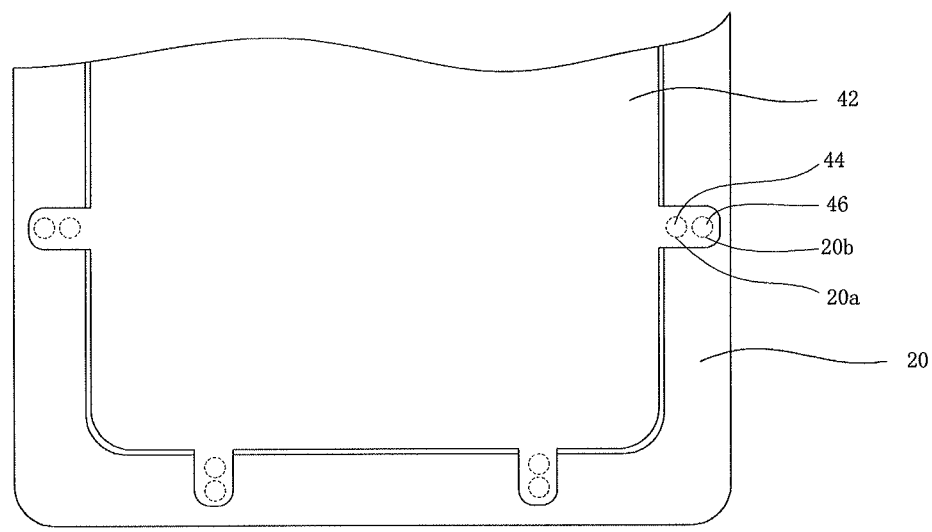
FIG. 2 is a schematic view of part of the electronic apparatus according to an exemplary embodiment of the present disclosure.

Referring to FIGS. 1 and 2, the electronic apparatus 100, according to an embodiment, may include a back shell 10, a middle frame assembly 30 including a middle frame 20 connected to the back shell 10 and a bearing plate 40 connected to the middle frame 20, a screen 50 embedded in the middle frame 20 and covering the bearing plate 40, and electronic components (not shown) arranged between the back shell 10 and the screen 50.

The back shell 10, which may be called as a back cover, may be formed of plastic, glass, ceramics, fiber composites, metal (e.g., stainless steel, aluminum, etc.), other suitable materials, or a combination of these materials. In some embodiments, the back shell 10 may have a rectangular configuration. In other embodiments, the back shell 10 may have other configurations, such as round, long round and ellipse etc.

Figure 3:
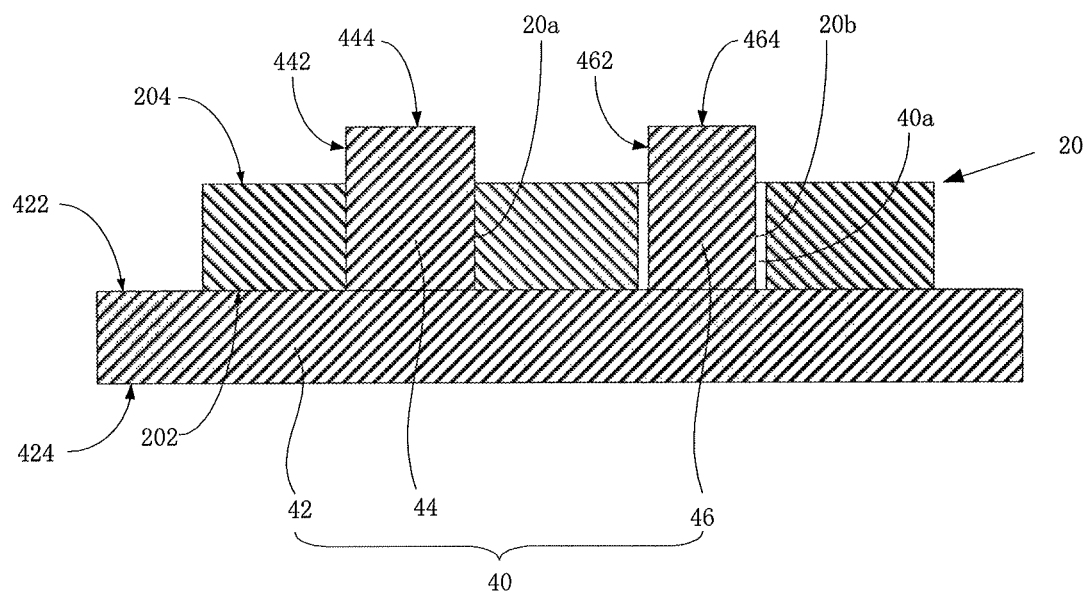
FIG. 3 is partial cross-sectional view of a middle frame assembly according to an embodiment of the present disclosure.

Referring to FIG. 3 and combining with FIG. 2, the middle frame 20 may include a first surface 202 and a second surface 204 opposite to the first surface 202. The middle frame 20 may define a first through hole 20a and a second through hole 20b spaced apart from the first through hole 20a. Both the first through hole 20a and the second through hole 20b may penetrate the first surface 202 and the second surface 204. In some embodiments, the middle frame 20 may also have a rectangular configuration and surround the back shell 10. In other embodiments, the middle frame 20 may have other configurations similar to that of the back shell 10. The middle frame 20 may be formed of metal, such as stainless steel, aluminum, or other suitable materials, which is not limited herein. In some embodiments, the middle frame 20 may be a frame outside the electronic apparatus.

The bearing plate 40 may be a circuit board. The electronic components of the electronic apparatus 100 may be arranged on the bearing plate 40. The bearing plate 40 may include a bearing body 42, a first extending portion 44 and a second extending portion 46 spaced apart from the first extending portion 44. The bearing body 42 may include a third surface 422 and a fourth surface 424 opposite to the third surface 422. Both the first extending portion 44 and the second extending portion 46 may extend from the third surface 422 and toward a direction away from the fourth surface 424. In some embodiments, the first extending portion 44 may include a first side surface 442 connected to the third surface 422 and a first end surface 444 away from the fourth surface 424. The second extending portion 46 may include a first side surface 462 connected to the third surface 422 and a second end surface 464 away from the fourth surface 424.

In some embodiments, the bearing plate 40 may have a one-piece structure, that is, the bearing body 42, the first extending portion 44 and the second extending portion 46 may be formed of a single piece. In this condition, the bearing body 42, the first extending portion 44 and the second extending portion 46 may be formed by Computer Numerical Control (CNC) machining or through stamping in a same process, which could reduce cost and shorten a processing period, thereby improving an efficiency of product development.

In other embodiments, the bearing body 42, the first extending portion 44 and the second extending portion 46 may be three independent structures. The first extending portion 44 and the second extending portion 46 may be fixed to the bearing body 42 by welding or other manners, which is not limited herein. Since the bearing body 42, the first extending portion 44 and the second extending portion 46 are independent structures, different processing technologies may be used to form the bearing body 42, the first extending portion 44 and the second extending portion 46. For instance, since a precision requirement of the bearing body 42 may be relatively low, the bearing body 42 may be formed through stamping. While a precision requirement of the first extending portion 44 and the second extending portion 46 may be relatively high, the first extending portion 44 and the second extending portion 46 may be formed through CNC machining. Therefore, the bearing body 42, the first extending portion 44 and the second extending portion 46 could be formed through different processing technologies according to different precision requirements, which could facilitate reducing cost and shortening processing period, thereby improving an efficiency of product development.

The first extending portion 44 may pass through the first through hole 20a and have an interference fit with the middle frame 20. The second extending portion 46 may pass through the second through hole 20b and have a clearance fit with the middle frame 20. Therefore, the middle frame 20 and the bearing plate 40 may be connected together firmly.

The "interference fit" may be a fastening between two parts which is achieved by friction after the parts are pushed together, rather than by any other means of fastening. In this embodiments, the first extending portion 44 may be inserted into the first through hole 20a, at least part of the first extending portion 44 in the first through hole 20a may have a cross section area slightly larger than that of the first through hole 20a, such that the friction between the first extending portion 44 and the middle frame 20 could be large enough to hold the first extending portion 44 in the first through hole 20a. Therefore, the middle frame 20 and the bearing plate 40 could be connected together as a whole tightly.

In the "clearance fit", the second extending portion 46 in the second through hole 20b may have a cross section area slightly smaller than that of the first through hole 22a, such that a clearance 40a may be defined by between the second extending portion 46 and the middle frame 20.

In some embodiments, a number of the first through hole 20a may be one or more, a number of the second through hole 20b may be one or more, which is not limited herein. A number of the first extending portion 44 may be equal to that of the first through hole 20a, and a number of the second extending portion 46 may be equal to that of the second through hole 20b. Each first extending portion 44 may pass through a corresponding first through hole 20a, and each second extending portion 46 may pass through a corresponding second through hole 20b.

In some embodiments, a peripheral contour of the first extending portion 44 and a peripheral contour of the second extending portion 46 may have a circular shape, a square shape, or other irregular shapes. An inner contour of the first through hole 20a may match with the peripheral contour of the first extending portion 44, and an inner contour of the second through hole 20b may match with the peripheral contour of the second extending portion 46.

In some embodiments, both the middle frame 20 and the bearing body 42 may be capable of plastic deformation.

The "plastic deformation" may be an irreversible deformation, for example, "plastic deformation" may be a physical phenomenon that an object (including fluids and solids) is deformed when subjected to an external force under certain conditions and cannot return to its original state after the external force is removed or disappeared. Since both the middle frame 20 and the bearing body 42 could be plastically deformable, both the middle frame 20 and the bearing body 42 could be formed through stamping process. Therefore, mass production could be realized, a product development period could be greatly shortened and cost could be reduced.

In some embodiments, a plastic-deformation degree of the middle frame 20 may be larger than a plastic-deformation degree of the bearing body 42. Therefore, the middle frame 20 can be plastically deformed by applying an impact force to the middle frame 20, such that the deformed middle frame 20 may expanse to abut against the first extending portion 44 more closely. Therefore, the middle frame 20 may be tightly coupled to the bearing body 42. The manner in which the impact force is applied to the middle frame 20 may be, but is not limited to, applying an impact force to the middle frame 20 by a punch.

In other embodiments, the first extending portion 44 may also be plastically deformable. A plastic-deformation degree of the first extending portion 44 may be smaller than that of the second extending portion 46. After the first extending portion 44 is stamped, the deformations of the first extending portion 44 may result in that the first extending portion 44 could be firmly connected to the middle frame 20, such that the bearing plate 40 may be connected to the middle frame 20 firmly.

The screen 50, according to an embodiment, may be substantially parallel to the back shell 10. The screen 50 may include pixels formed from light-emitting diodes (LEDs), organic LEDs (OLEDs), plasma cells, electrowetting pixels, electrophoretic pixels, liquid crystal display (LCD) components, or other suitable pixel structures. A screen cover layer such as a layer of clear glass or plastic may cover the surface of the screen 50 or the outermost layer of the screen 50 may be formed from a color filter layer, thin-film transistor layer, or other display layer. In this embodiment, the screen 50 may further incorporate touch electrodes and be used as a touch screen for inputting information.

Since the second extending portion 46 has a clearance fit with the middle frame 20, a clearance 40a may be defined between the second extending portion 46 and the middle frame 20. When welding the bearing plate 40 to the middle frame 20, the clearance 40a may provide enough space for the deformation of the middle frame 20 and the bearing plate 40, which may help to release stress between the middle frame 20 and the bearing plate 40.

Figure 4:
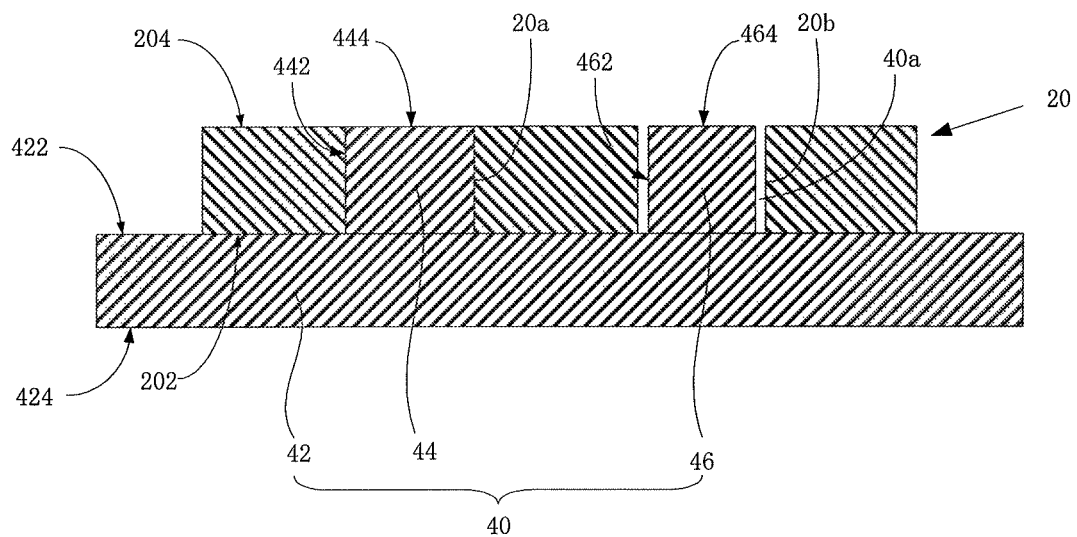
FIG. 4 is a partial cross-sectional view of a middle frame assembly according to another embodiment of the present disclosure.

In another embodiment, referring to FIG. 4, the middle frame assembly 30 may be similar to that of the above embodiment, except that the first end surface 444 of the first extending portion 44 may be flush with the second surface 204 of the middle frame 20, the second end surface 464 of the second extending portion 46 may be flush with the second surface 204 of the middle frame 20, the first surface 202 and the third surface 422 may abut against each other. The first surface 202 and the third surface 422 may abut against each other, that is, the first surface 202 may contact with the third surface 422 closely, such that space occupied by the whole of the middle frame assembly 30 could be reduced. Therefore, volume of the electronic apparatus could be reduced.

Figure 5:
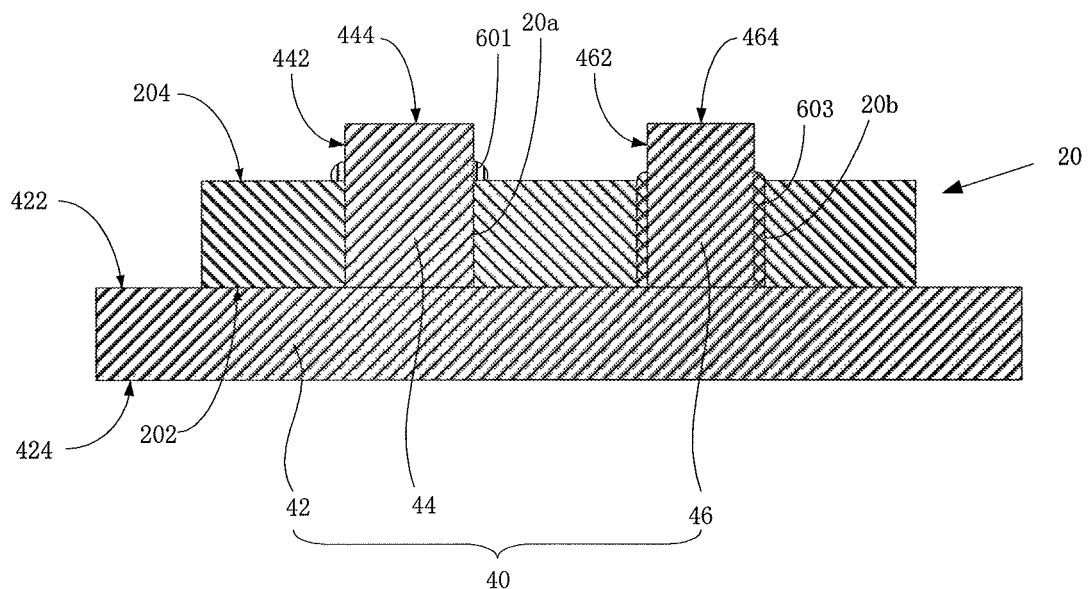
FIG. 5 is a partial cross-sectional view a middle frame assembly according to a still another embodiment of the present disclosure.

In still another embodiment, referring to FIG. 5, the middle frame assembly 30 may be similar to that of the above embodiment, except that a first connecting medium 601 may be disposed between the first extending portion 44, in particularly, the first side surface 442 of the first extending portion 44 and the middle frame 20 to connect the first extending portion 44 and the middle frame 20 together, a second connecting medium 603 may be filled in the clearance 40a to connect the second extending portion 46 and the middle frame 20 together.

Specifically, method of forming the first connecting medium 601 may include: welding the first extending portion 44 to the middle frame 20. During the welding process, first welding fluid may be formed at the connection between the first extending portion 44 to the middle frame 20. After cooling the first welding fluid, a first connecting medium 601 may be formed, and the first connecting medium 601 may connect to both the first extending portion 44 and the middle frame 20, such that the first extending portion 44 and the middle frame 20 may be connected together. In other embodiments, method of forming the first connecting medium 601 may include: coating glue at the connection between the first extending portion 44 and the middle frame 20. After the glue is cooled and cured, the glue may form the first connecting medium 601 to connect the first extending portion 44 and the middle frame 20 together.

Method of filling the second connecting medium 603 into the clearance 40a may include: welding the second extending portion 46 to the middle frame 20. During the welding process, second welding fluid may be filled into the clearance 40a. After cooling the second welding fluid, a second connecting medium 603 may be formed, and the second connecting medium 603 may connect to both the second extending portion 46 and the middle frame 20, such that the second extending portion 46 and the middle frame 20 may be connected together. In other embodiments, the method of filling the second connecting medium 603 into the clearance 40a may include: filling glue into the clearance 40a between the second extending portion 46 and the middle frame 20. After the glue is cooled and cured, the glue may form the second connecting medium 603 to connect the second extending portion 44 and the middle frame 20 together.

Figure 6:
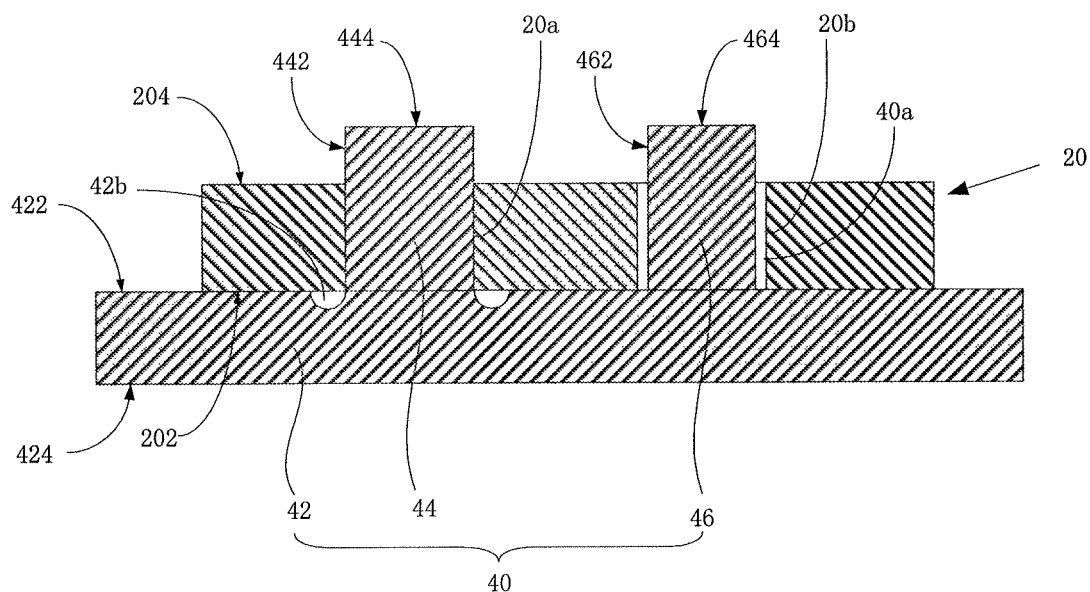
FIG. 6 is a partial cross-sectional view a middle frame assembly according to a further another embodiment of the present disclosure.

In further another embodiment, referring to FIG. 6, the middle frame assembly 30 may be similar to that of the above embodiment, except that a first slot 42b may be defined by the bearing body 42 at the connection between the bearing body 42 and the first extending portion 44.

In an embodiment, the first slot 42b may be defined at a position that the bearing body 42 faces to the first extending portion 44. When the first extending portion 44 is stamped to deform, the first slot 42b could receive at least part of the deformed first extending portion 44. Without the first slot 42b, the at least part of the deformed first extending portion 44 may form between the first surface 202 and the third surface 422, which may result in that the first surface 202 and/or the third surface 422a may be unevenness, a gap may be formed between the first surface 202 and the third surface 422, and that the first surface 202 and the third surface 422 could not contact with each other. The first slot 42b could prevent the at least part of the deformed first extending portion 44 from forming between the first surface 202 and the third surface 422, and ensure that the first surface 202 and the third surface 422 contact with each other. Stress concentration in the connection between the middle frame 20 and the bearing plate 40 could be eliminated effectively.

Figure 7:
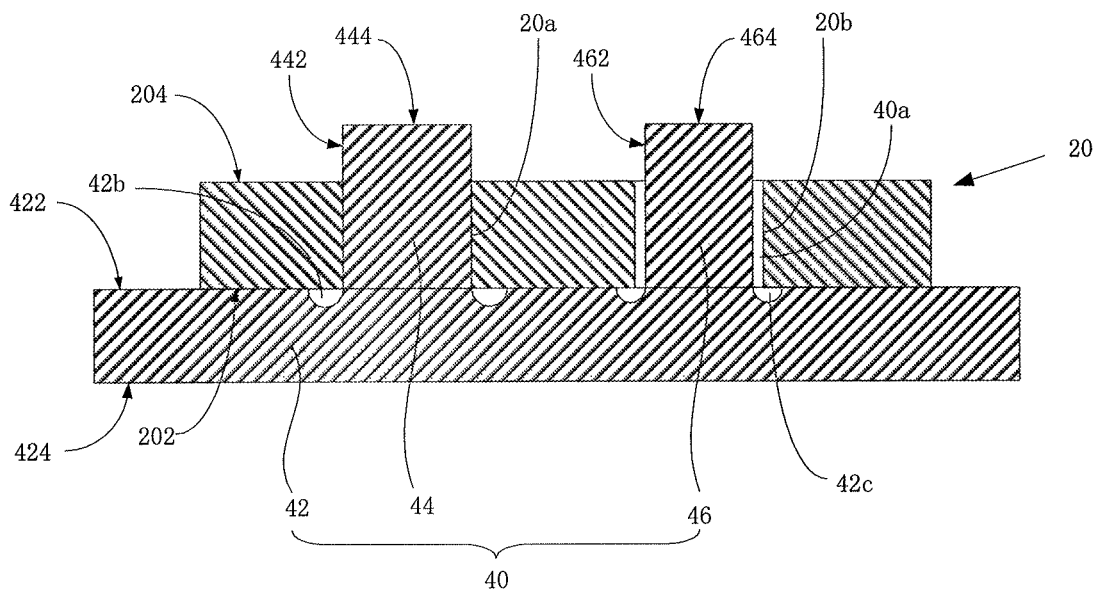
FIG. 7 is a schematic view of part of the electronic apparatus according to another exemplary embodiment of the present disclosure.

In other embodiments, referring to FIG. 7, the middle frame assembly 30 may be similar to that of the above embodiment, except that a second slot 42c surrounding the second extending portion 46 may be defined by the bearing body 42 at the connection between the bearing body 42 and the second extending portion 46. A volume of the first slot 42b may be larger than a volume of the second slot 42c.

When forming the second extending portion 46, the connection between the second extending portion 46 and the bearing body 42 may not be a right angle, such as, smooth transition, the middle frame 20 may only contact with the connection between the second extending portion 46 and the bearing body 42, and may not contact with the bearing plate 42 closely. This condition could be avoided by forming the second slot 42c surrounding the second extending portion 46, such that the middle frame 20 could be laminated on the bearing body 42.

Figure 8:
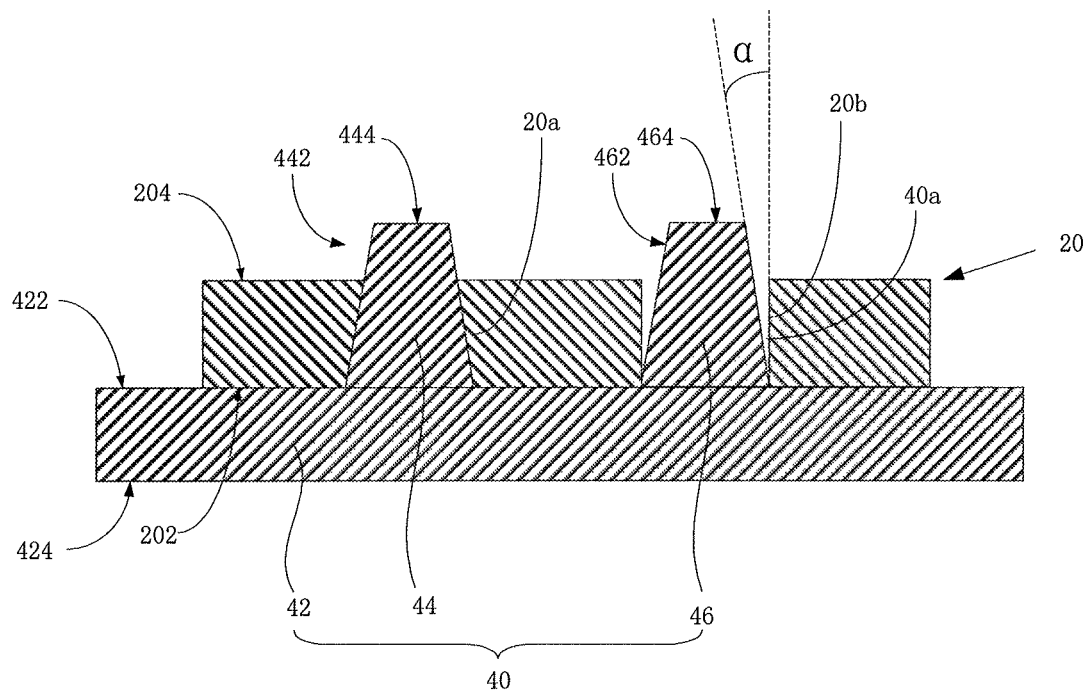
FIG. 8 is a partial cross-sectional view of a middle frame assembly according to still another embodiment of the present disclosure.

In further another embodiment, referring to FIG. 8, the middle frame assembly 30 may be similar to that of the above embodiment, except that cross section area of a peripheral contour of the first extending portion 44 may be gradually decreased from the third surface 422 toward a direction away from the fourth surface 424. Cross section area of a peripheral contour of the second extending portion 46 may be gradually decreased from the third surface 422 toward a direction away from the fourth surface 424.

Specifically, when the first extending portion 44 and the second extending portion 46 is formed by a stamping mould, in order to separate the bearing plate 40 from the mould, a draft angle α may be generally formed. In some embodiments, the draft angle α may be an angle between the side surface 442 and a flat perpendicular to the third surface 422, and an angle between the side surface 464 and a flat perpendicular to the third surface 422. The draft angle α may be different for the moulds of different materials. For wood mold, the draft angle α may be generally 1°~3°. For metal mold, the draft angle a may be generally 0.5°~2°. It is necessary to select an appropriate draft angle α, for example, an overlarge draft angle α may tend to result in that the bearing plate 40 may not have enough regidity, and if a draft angle a is too small, a demolding of the bearing plate 40 may be difficult. In the present disclosure, the material of the bearing plate 40 may be an alloy material. In some embodiments, the assembled middle frame 20 and the bearing plate 40 may need to be welded together, since a variation range of the stiffness of the alloy material is wide, there is no need to worry about the problem that the rigidity of the bearing board 200 cannot be guaranteed. Therefore, in an embodiment, the draft angle α of the present disclosure may range from 0.5° to 3°. On one hand, the rigidity requirement of the bearing plate 40 could be satisfied, and on the other hand, the demolding of the bearing plate 40 may be easier. In addition, the size of the draft angle may be further determined by the material of the bearing plate 40 and the texture on the surface of the bearing plate 40 contacting with the mould. For bearing plate 40 with different materials or with different texture trend on surface, it is necessary to adjust the draft angle.

Figure 9:
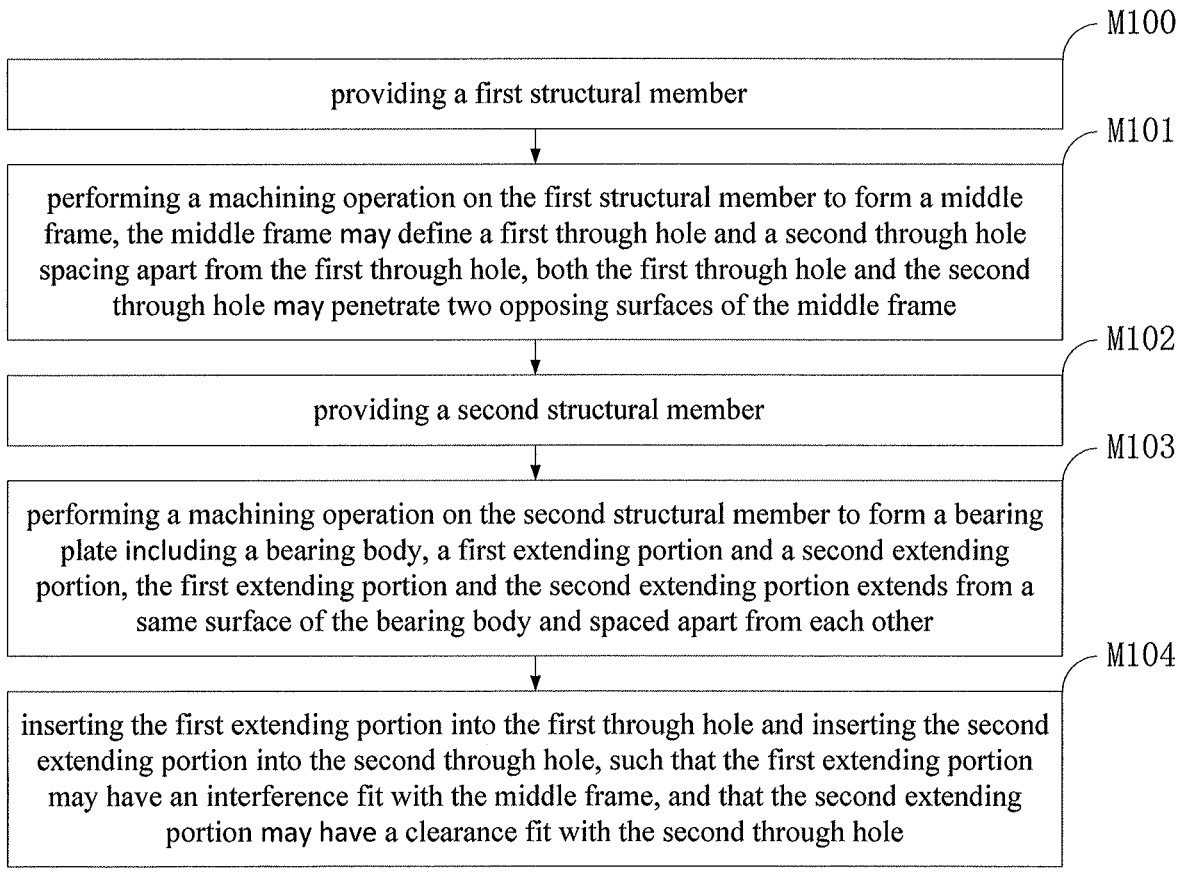
FIG. 9 is a flow chart of a method for manufacturing a middle frame assembly according to an embodiment of the present disclosure.

Referring to FIG. 9 and combining with FIG. 3, a flow chart diagram of a method for manufacturing a middle frame assembly according to an embodiment of the present application is depicted. The method may include:

M100, providing a first structural member.

M101, performing a machining operation on the first structural member to form a middle frame, the middle frame may define a first through hole and a second through hole spacing apart from the first through hole, both the first through hole and the second through hole may penetrate two opposing surfaces of the middle frame.

At block M101, the first through hole 20a and the second through hole 20b may be formed through a stamping processing, a CNC machining, a combination of the stamping processing and the CNC machining or other processing methods.

M102, providing a second structural member.

M103, performing a machining operation on the second structural member to form a bearing plate including a bearing body, a first extending portion and a second extending portion, the first extending portion and the second extending portion extends from a same surface of the bearing body and spaced apart from each other.

In some embodiments, the second structural member may be machined by stamping processing, a CNC machining. In other embodiments, the second structural member may be machined by stamping processing to form the bearing body 42 firstly, then, the second structural member may be machined by CNC machining to form the first extending portion 44 and the second extending portion 46, and finally, the first extending portion 44 and the second extending portion 46 may be welded to the bearing body 42. Therefore, different structures could be machined by different processes, which could save processing time, and shorten the processing period and reduce cost.

M104, inserting the first extending portion into the first through hole and inserting the second extending portion into the second through hole, such that the first extending portion may have an interference fit with the middle frame, and that the second extending portion may have a clearance fit with the second through hole.

Figure 10:
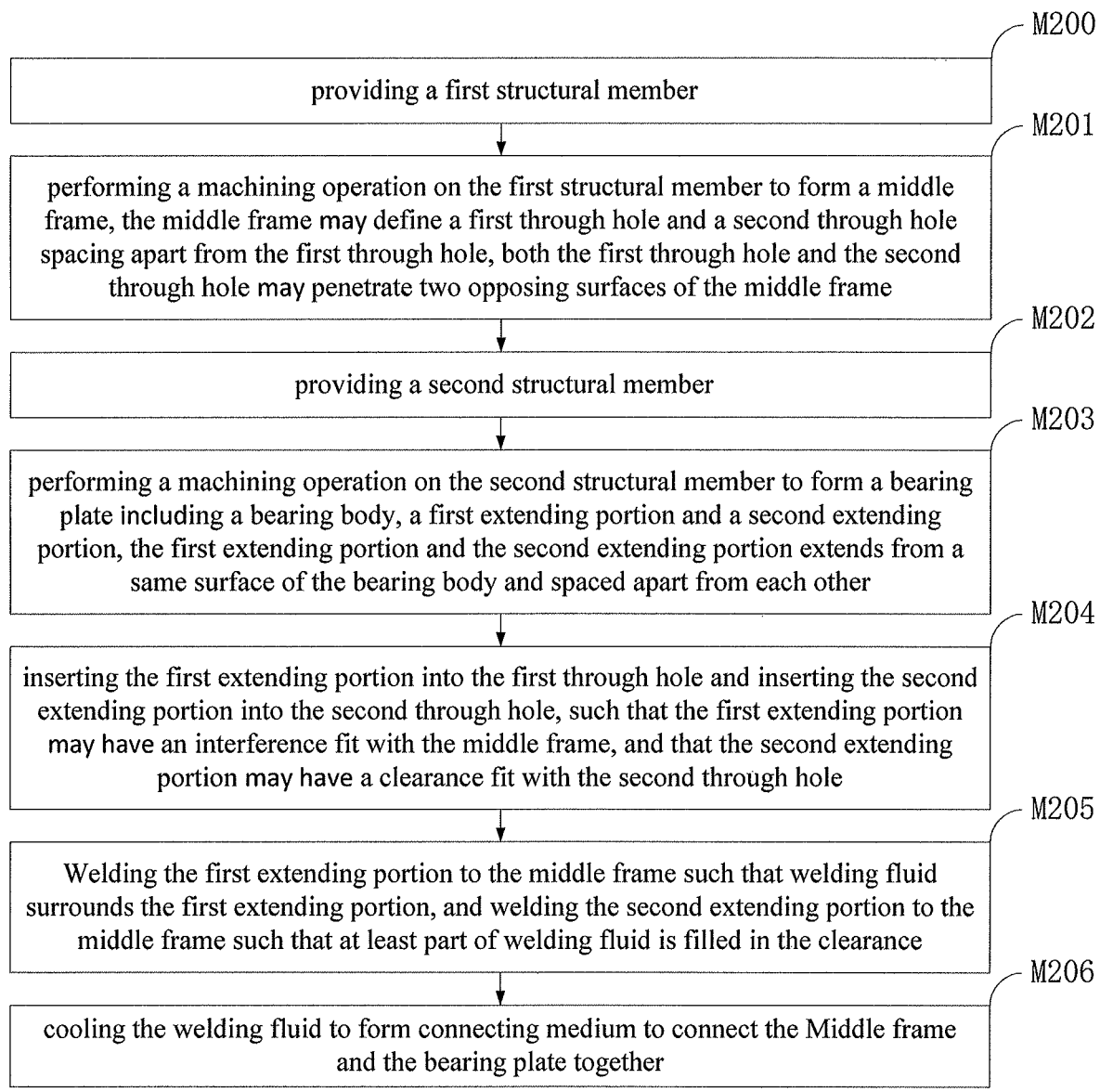
FIG. 10 is a flow chart of a method for manufacturing a middle frame assembly according to another embodiment of the present disclosure.

Referring to FIG. 10 and combining with FIG. 5, a flow chart diagram of a method for manufacturing a middle frame assembly according to another embodiment of the present application is depicted. The method may include:

M200, providing a first structural member.

M201, performing a machining operation on the first structural member to form a middle frame, the middle frame may define a first through hole and a second through hole spacing apart from the first through hole, both the first through hole and the second through hole may penetrate two opposing surfaces of the middle frame.

M202, providing a second structural member.

M203, performing a machining operation on the second structural member to form a bearing plate including a bearing body, a first extending portion and a second extending portion, the first extending portion and the second extending portion extends from a same surface of the bearing body and spaced apart from each other.

At block M203, a clearance 40a may be defined between the second extending portion 46 and the middle frame 20.

M204, inserting the first extending portion into the first through hole and inserting the second extending portion into the second through hole, such that the first extending portion may have an interference fit with the middle frame, and that the second extending portion may have a clearance fit with the second through hole.

M205, welding the first extending portion to the middle frame such that welding fluid surrounds the first extending portion, and welding the second extending portion to the middle frame such that at least part of welding fluid is filled in the clearance.

In some embodiments, during welding the second extending portion 46 to the middle frame 20, the welding fluid formed after welding may be blown from the second surface 204 to the clearance 40a quickly, and that the cooled welding fluid could connect the second extending portion 46 and the middle frame 20 more firmly. In some embodiments, the blowing device for blowing the welding fluid may be a blower, a high pressure nozzle, an air gun, or the like.

In addition, it should be noted that a number of the blowing device may be one or more, which is not limited herein. Specifically, the number of the blowing device may be determined according to the welding effect of the second extending portion 46 and the middle frame 20.

In addition, times of the blowing the welding fluid may be one or more, which is not limited herein. Specifically, times of the blowing the welding fluid may be determined according to the welding effect of the clearance 40a. When the second extension portion 46 and the middle frame 20 are welded together, the welding fluid filled in the clearance 40a may be blown, which could facilitate the flowing of the welding fluid, such that the bubbles in the welding fluid filled in the clearance 40a could be discharged. Therefore, connecting strength between the second extending portion 46 and the middle frame 20 could be enhanced.

In addition, a direction of blowing the welding fluid could be changed. The direction of blowing the welding fluid may be substantially perpendicular to the second surface 204 of the middle frame 20, or substantially parallel to the second surface 204, or at a certain angle with the second surface 204. For example, if the clearance 40a extends in a certain direction, the welding fluid may be blown along the extending direction of the clearance 40a, such that the welding fluid could flow along the extending direction of the clearance 40a. Therefore, the welding fluid could fill the clearance 40a rapidly. In addition, it could facilitate the discharging of the bubbles in the welding fluid to blow the welding fluid, reduce the pores, and reduce the influence on the strength and appearance quality of the welding, such that the welding connection between the second extending portion 46 and the middle frame 20 could be more firmly.

In other embodiments, the welding fluid may be pushed to flow into the clearance 40a by pressurizing, or pumping, the details may be similar to that of the blowing, which are not recited herein.

M206, cooling the welding fluid to form connecting medium to connect the middle frame and the bearing plate together.

At block M206, the welding fluid between the first extending portion 44 and the middle frame 20 may be cooled to form a first connecting medium 601, the welding fluid between the first extending portion 44 and the middle frame 20 may be cooled to form a second connecting medium 603. The cooling method may include: oil cooling, air cooling, water cooling or the like.

Figure 11:
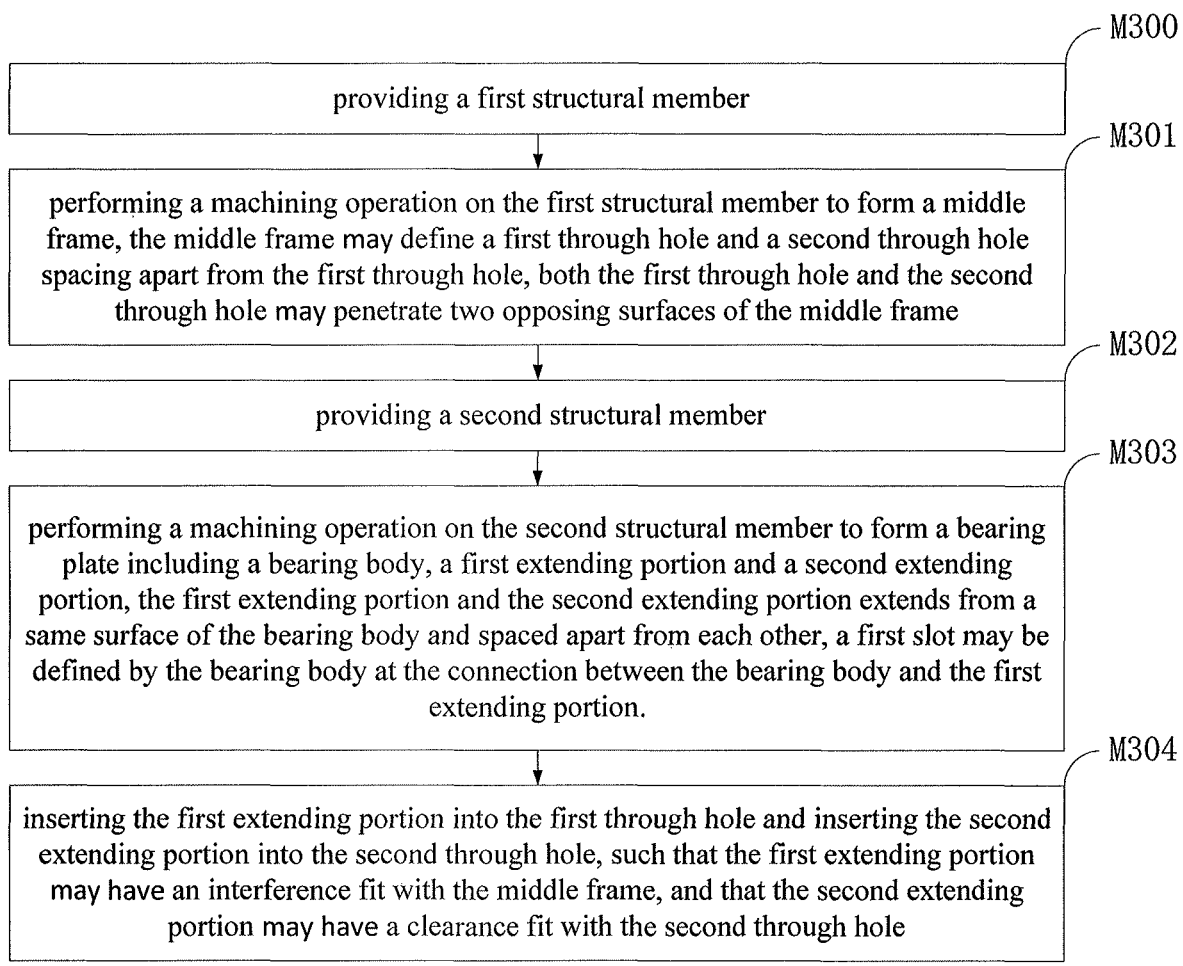
FIG. 11 is a flow chart of a method for manufacturing a middle frame assembly according to still another embodiment of the present disclosure.

Referring to FIG. 11 and combining with FIG. 6, a flow chart diagram of a method for manufacturing a middle frame assembly according to another embodiment of the present application is depicted. The method may include:

M300, providing a first structural member.

M301, performing a machining operation on the first structural member to form a middle frame, the middle frame may define a first through hole and a second through hole spacing apart from the first through hole, both the first through hole and the second through hole may penetrate two opposing surfaces of the middle frame.

M302, providing a second structural member.

M303, performing a machining operation on the second structural member to form a bearing plate including a bearing body, a first extending portion and a second extending portion, the first extending portion and the second extending portion extends from a same surface of the bearing body and spaced apart from each other, a first slot may be defined by the bearing body at the connection between the bearing body and the first extending portion.

At block M303, the first slot 42b may be formed by CNC machining or other processes.

M304, inserting the first extending portion into the first through hole and inserting the second extending portion into the second through hole, such that the first extending portion may have an interference fit with the middle frame, and that the second extending portion may have a clearance fit with the second through hole.

Figure 12:
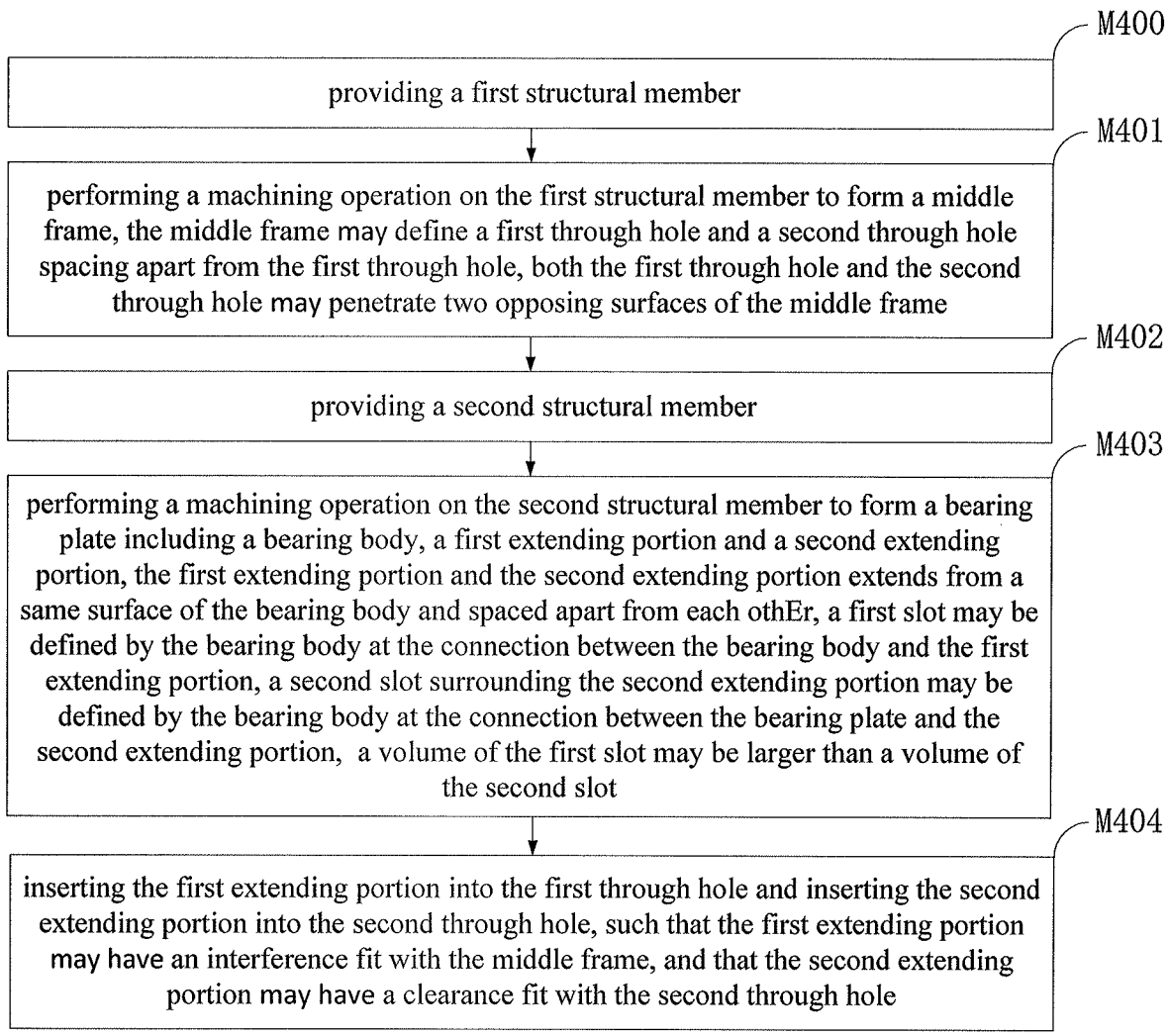
FIG. 12 is a flow chart of a method for manufacturing a middle frame assembly according to further another embodiment of the present disclosure.

Referring to FIG. 12 and combining with FIG. 7, a flow chart diagram of a method for manufacturing a middle frame assembly according to another embodiment of the present application is depicted. The method may include:

M400, providing a first structural member.

M401, performing a machining operation on the first structural member to form a middle frame, the middle frame may define a first through hole and a second through hole spacing apart from the first through hole, both the first through hole and the second through hole may penetrate two opposing surfaces of the middle frame.

M402, providing a second structural member.

M403, performing a machining operation on the second structural member to form a bearing plate including a bearing body, a first extending portion and a second extending portion, the first extending portion and the second extending portion extends from a same surface of the bearing body and spaced apart from each other, a first slot may be defined by the bearing body at the connection between the bearing body and the first extending portion, a second slot surrounding the second extending portion may be defined by the bearing body at the connection between the bearing plate and the second extending portion a volume of the first slot may be larger than a volume of the second slot.

M404, inserting the first extending portion into the first through hole and inserting the second extending portion into the second through hole, such that the first extending portion may have an interference fit with the middle frame, and that the second extending portion may have a clearance fit with the second through hole.

Figure 13:
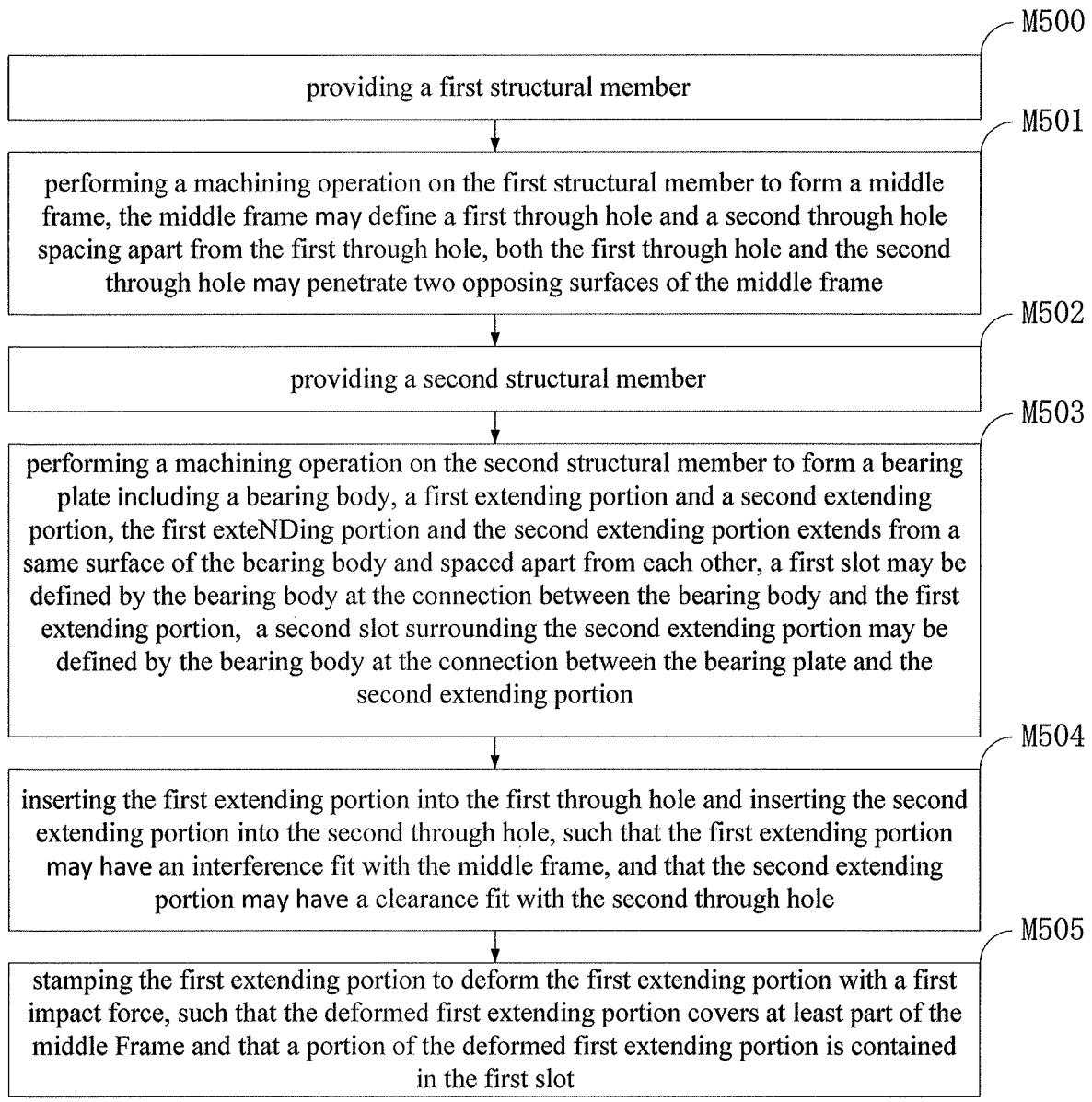
FIG. 13 is a flow chart of a method for manufacturing a middle frame assembly according to another embodiment of the present disclosure.

Referring to FIG. 13, a flow chart diagram of a method for manufacturing a middle frame assembly according to another embodiment of the present application is depicted. The method may include:

M500, providing a first structural member.

M501, performing a machining operation on the first structural member to form a middle frame, the middle frame may define a first through hole and a second through hole spacing apart from the first through hole, both the first through hole and the second through hole may penetrate two opposing surfaces of the middle frame.

M502, providing a second structural member.

M503, performing a machining operation on the second structural member to form a bearing plate including a bearing body, a first extending portion and a second extending portion, the first extending portion and the second extending portion extends from a same surface of the bearing body and spaced apart from each other, a first slot may be defined by the bearing body at the connection between the bearing body and the first extending portion, a second slot surrounding the second extending portion may be defined by the bearing body at the connection between the bearing plate and the second extending portion.

M504, inserting the first extending portion into the first through hole and inserting the second extending portion into the second through hole, such that the first extending portion may have an interference fit with the middle frame, and that the second extending portion may have a clearance fit with the second through hole.

M505, stamping the first extending portion to deform the first extending portion with a first impact force, such that the deformed first extending portion covers at least part of the middle frame and that a portion of the deformed first extending portion is contained in the first slot.

In some embodiments, the first extending portion 44 may be stamped a plurality of times with different impact force. The different impact force may be gradually increased with the increasing of the stamping times.

The first extending portion 44 may be stamped a plurality of times in order to change metal properties of the first extending portion 44, change the crystal phase structure of metal structures, and obtain more excellent mechanical properties.

For example, the first extending portion 44 may be stamped n times, and the impact force of the $n^{th}$ stamping may be defined as Fn, then Fn>Fn−1> . . . >F1 may be satisfied, n may be an integer greater than or equal to 2. When the the first extending portion 44 are stamped in this way, the Fn−1 corresponding to the $n-1^{th}$ stamping may smaller than the Fn corresponding to the $n^{th}$ stamping, and plasticity of the first extending portion 44 could be improved. In other words, strength of the impact force of a stamping may be greater than the strength of the impact force of a last stamping, which could improve plasticity of the first extending portion 44, increase flexibilities of the first extending portion 44, and improve the metal cutting performance of the first extending portion 44.

Referring to FIG. 13, a flow chart diagram of a method for manufacturing a middle frame assembly according to another embodiment of the present application is depicted. The method may include:

M600, providing a first structural member.

M601, performing a machining operation on the first structural member to form a middle frame, wherein the middle frame may define a first through hole and a second through hole spacing apart from the first through hole, both the first through hole and the second through hole may penetrate two opposing surfaces of the middle frame.

M602, providing a second structural member.

M603, performing a machining operation on the second structural member to form a bearing plate including a bearing body, a first extending portion and a second extending portion, wherein the first extending portion and the second extending portion extends from a same surface of the bearing body and spaced apart from each other.

M604, performing a smoothing process of a first precision on a surface of the first extending portion, and performing a smoothing process of a second precision on a surface of the second extending portion, wherein the first precision is larger than the second precision.

At block M604, since the first extending portion has an interference fit with the middle frame, the second extending portion has a clearance fit with the middle frame, a precision requirement of the first extending portion may be relative high, a precision requirement of the second extending portion may be relative low. Therefore, the first extending portion could be inserted into the first though hole easily, so as to shorten the process period and reduce cost.

M605, inserting the first extending portion into the first through hole and inserting the second extending portion into the second through hole, such that the first extending portion may have an interference fit with the middle frame, and that the second extending portion may have a clearance fit with the second through hole.

Figure 14:
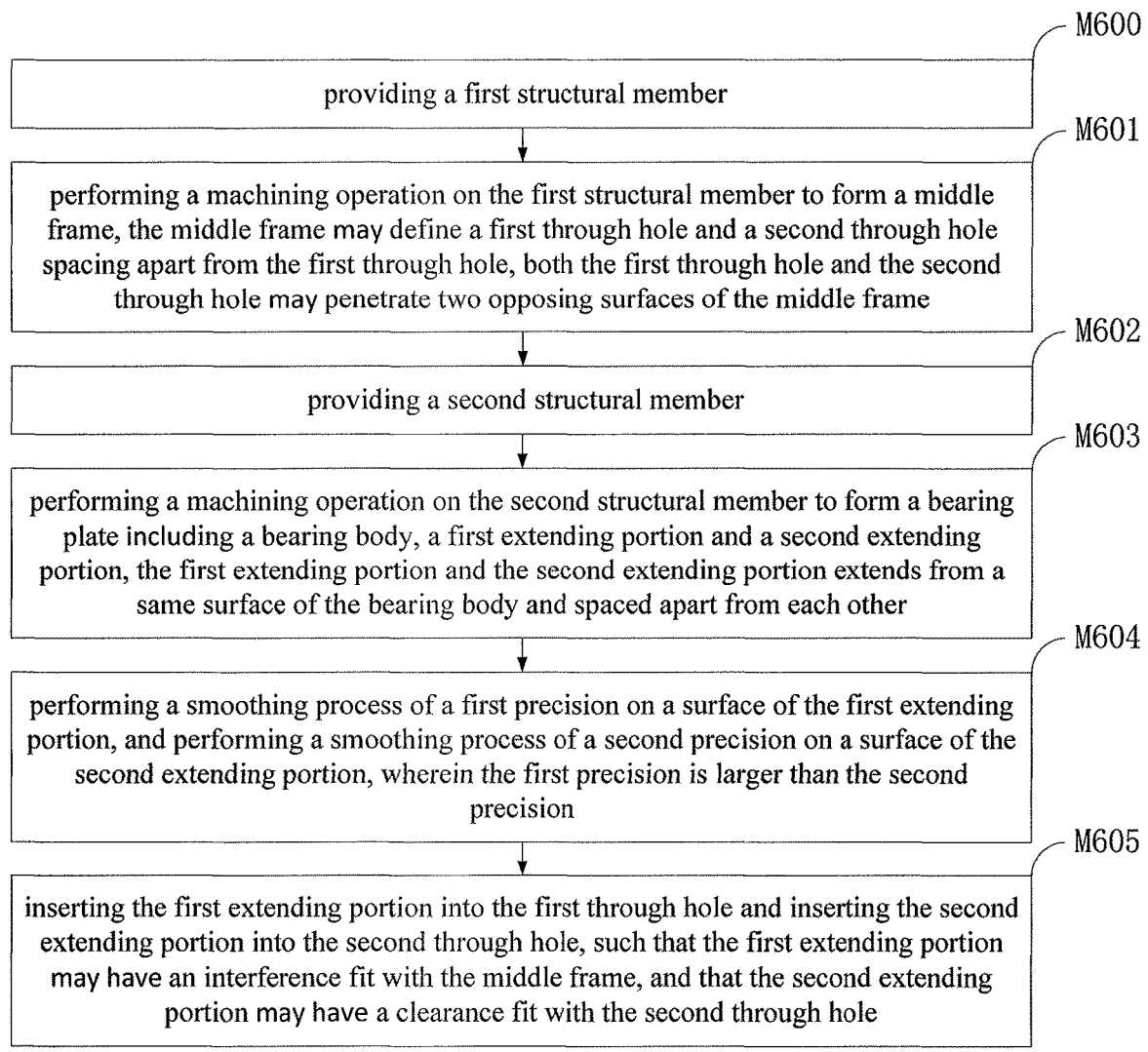
FIG. 14 is a flow chart of a method for manufacturing a middle frame assembly according to still another embodiment of the present disclosure.
Figure 15:
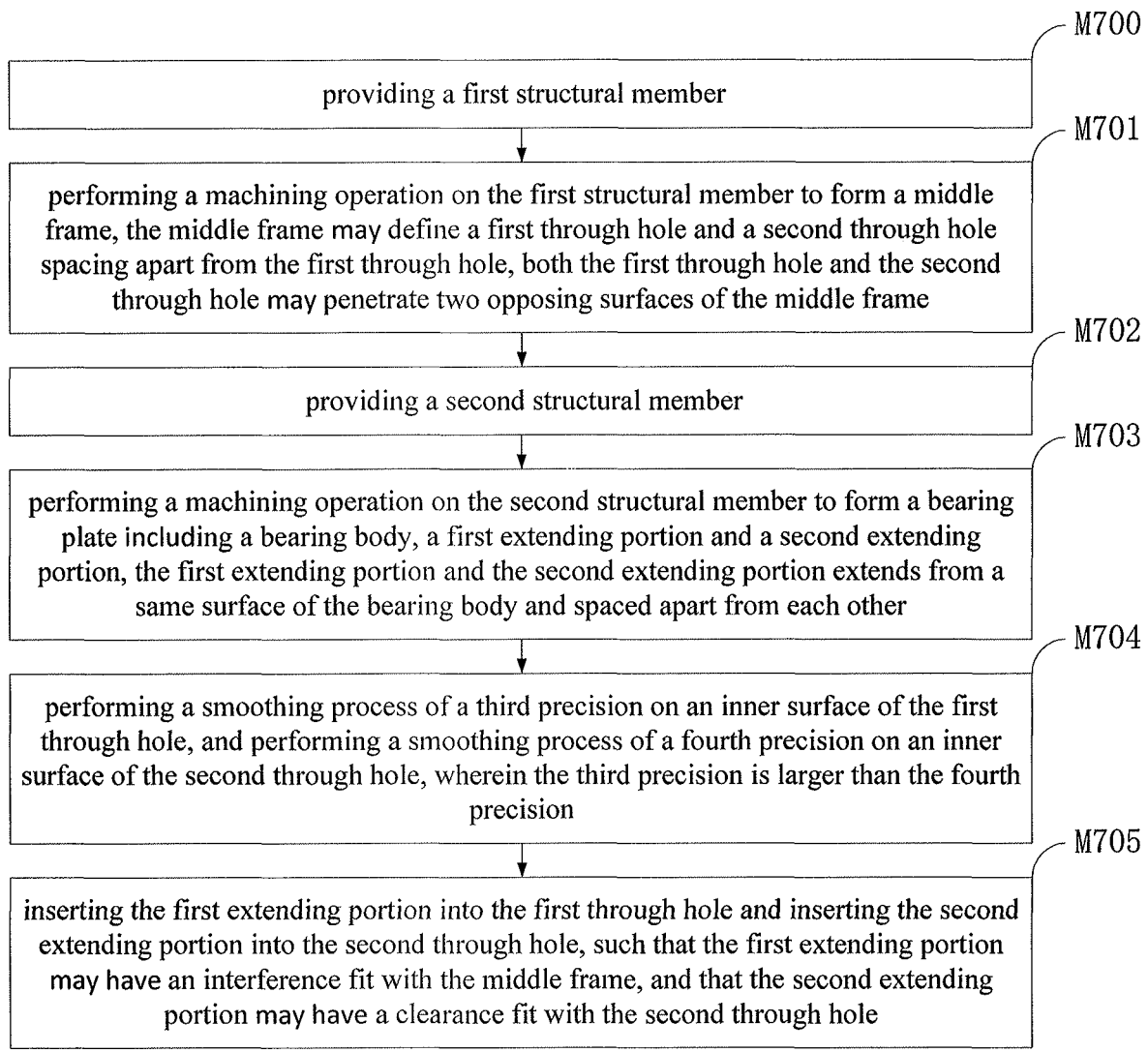
FIG. 15 is a flow chart of a method for manufacturing a middle frame assembly according to further another embodiment of the present disclosure.

Referring to FIG. 14, a flow chart diagram of a method for manufacturing a middle frame assembly according to another embodiment of the present application is depicted. The method may include:

M700, providing a first structural member.

M701, performing a machining operation on the first structural member to form a middle frame, wherein the middle frame may define a first through hole and a second through hole spacing apart from the first through hole, both the first through hole and the second through hole may penetrate two opposing surfaces of the middle frame.

M702, providing a second structural member.

M703, performing a machining operation on the second structural member to form a bearing plate including a bearing body, a first extending portion and a second extending portion, wherein the first extending portion and the second extending portion extends from a same surface of the bearing body and spaced apart from each other.

M704, performing a smoothing process of a third precision on an inner surface of the first through hole, and performing a smoothing process of a fourth precision on an inner surface of the second through hole, wherein the third precision is larger than the fourth precision.

At block M704, since the first extending portion has an interference fit with the middle frame, the second extending portion has a clearance fit with the middle frame, a precision requirement of the first through hole may be relative high, a precision requirement of the second through hole may be relative low. Therefore, the first extending portion could be inserted into the first though hole easily, so as to shorten the process period and reduce cost.

M705, inserting the first extending portion into the first through hole and inserting the second extending portion into the second through hole, such that the first extending portion may have an interference fit with the middle frame, and that the second extending portion may have a clearance fit with the second through hole.

According to an aspect of the present disclosure, a middle frame assembly may be provided. The middle frame may include a middle frame including a first surface and a second surface opposite to the first surface and defining a first through hole and a second through hole spaced apart from the first through hole, both the first through hole and the second through hole may penetrate the first surface and the second surface; and a bearing plate including a bearing body having a third surface, a first extending portion extending from the third surface and configured to pass through the first through hole and have an interference fit with the middle frame, and a second extending portion extending from the third surface, spaced apart from the first extending portion and configured to pass through the second through hole and have a clearance fit with the middle frame.

In an embodiment, a first connecting medium may be disposed between the first extending portion and the middle frame to connect the first extending portion and the middle frame together. A clearance may be defined between the second extending portion and the middle frame, the clearance may be filled with a second connecting medium to connect the second extending portion and the middle frame together.

In another embodiment, a first slot may be defined by the bearing body at the connection between the bearing body and the first extending portion, the first slot may be configured to contain a portion of the first extending portion after the first extending portion is stamped to deform, such that the first surface and the third surface contact with each other.

In still another embodiment, a second slot surrounding the second extending portion may be defined by the bearing body at the connection between the bearing body and the second extending portion; a volume of the first slot may be larger than a volume of the second slot.

In further another embodiment, both the middle frame and the bearing body may be plastically deformable, a plastic-deformation degree of the middle frame may be larger than a plastic deformation degree of the bearing body.

In another embodiment, the first extending portion may be plastically deformable.

In still another embodiment, the first extending portion may include a first end surface away from the third surface, the first end surface may be flush with the second surface, the second extending portion may include a second end surface away from the third surface, the second end surface may be flush with the second surface.

In further another embodiment, the first surface and the third surface may abut against each other.

In another embodiment, the bearing body may have a fourth surface opposite to the third surface, both cross section area of a peripheral contour of the first extending portion and cross section area of a peripheral contour of the second extending portion may be gradually decreased from the third surface toward a direction away from the fourth surface.

According to another aspect of the present disclosure, a method for manufacturing a middle frame assembly may be provided. The method may include providing a first structural member; performing a machining operation on the first structural member to form a middle frame, the middle frame may define a first through hole and a second through hole spacing apart from the first through hole, both the first through hole and the second through hole may penetrate two opposing surfaces of the middle frame; providing a second structural member; performing a machining operation on the second structural member to form a bearing plate comprising a bearing body, a first extending portion and a second extending portion, the first extending portion and the second extending portion may extend from a same surface of the bearing body and spaced apart from each other; and inserting the first extending portion into the first through hole and inserting the second extending portion into the second through hole, such that the first extending portion may have an interference fit with the middle frame, and that the second extending portion may have a clearance fit with the middle frame.

In an embodiment, a clearance may be defined between the second extending portion and the middle frame. The method may further include welding the first extending portion to the middle frame such that welding fluid surrounds the first extending portion, and welding the second extending portion to the middle frame such that at least part of welding fluid is filled in the clearance and cooling the welding fluid to form connecting medium to connect the middle frame and the bearing plate together.

In another embodiment, the performing a machining operation on the second structural member to form a bearing plate including a bearing body, a first extending portion and a second extending portion further includes: forming a first slot at the connection between the bearing body and the first extending portion.

In still another embodiment, further includes: forming a second slot surrounding the second extending portion at the connection between the bearing body and the second extending portion, a volume of the first slot may be larger than a volume of the second slot.

In further another embodiment, after the inserting the first extending portion into the first through hole and inserting the second extending portion into the second through hole, the method further include: stamping the first extending portion to deform, such that the deformed first extending portion may cover at least part of the middle frame and that a portion of the deformed first extending portion is contained in the first slot.

In an embodiment, before the inserting the first extending portion into the first through hole and inserting the second extending portion into the second through hole, the method further includes: performing a smoothing process of a first precision on a surface of the first extending portion, and performing a smoothing process of a second precision on a surface of the second extending portion, the first precision may be larger than the second precision.

In another embodiment, before the inserting the first extending portion into the first through hole and inserting the second extending portion into the second through hole, the method further includes: performing a smoothing process of a third precision on an inner surface of the first through hole, and performing a smoothing process of a fourth precision on an inner surface of the second through hole, the third precision may be larger than the fourth precision.

According to still another aspect of the present disclosure, an electronic apparatus may be provided. The electronic apparatus may include a back shell, a middle frame assembly connected to the back shell and defining at least one first through hole and at least one second through hole and a bearing pleat. The bearing pleat may include a bearing body having a third surface, and at least one first extending portion and at least one second extending portion extending from the third surface and spaced apart from each other, the at least one first extending portion may be inserted into the at least one first through hole and have an interference fit with the middle frame, the at least one second extending portion may be inserted into the at least one second through hole and have a clearance fit with the middle frame.

In an embodiment, a first connecting medium may be disposed between the at least one first extending portion and the middle frame to connect the at least one first extending portion and the middle frame together; a clearance may be defined between the at least one second extending portion and the middle frame, the clearance may be filled with a second connecting medium to connect the at least one second extending portion and the middle frame together.

In another embodiment, at least one first slot may be defined by the bearing body at the connection between the bearing body and the at least one first extending portion, the at least one first slot may be configured to contain a portion of the at least one first extending portion after the first extending portion is stamped to deform, such that the first surface and the third surface contact with each other; at least one second slot surrounding the at least one second extending portion may be defined by the bearing body at the connection between the bearing body and the at least one second extending portion; a volume of the at least one first slot may be larger than a volume of the at least one second slot.

In still another embodiment, the at least one first extending portion may include a first end surface away from the third surface, the first end surface may be flush with the second surface; the at least one second extending portion may include a second end surface away from the third surface, the second end surface may be flush with the second surface.

For one skilled in the art, it is clear that the present application is not limited to the details of the above exemplary embodiments, and that the present application can be implemented in other specific forms without deviating from the spirit or basic characteristics of the application. Therefore, at any point, the embodiments should be regarded as exemplary and unrestrictive, and the scope of the present application is defined by the appended claims, rather than the above description. Therefore, all changes within the meaning and scope of the equivalent elements of the claim are intended to be included. Any appended label recited in the claims shall not be regarded as a limitation to the claims. In addition, apparently, the terms "include", "comprise" and the like do not exclude other units or steps, and the singular does not exclude plural.

It should be noted that, the foregoing disclosed is merely exemplary implementations and it is not intended to limit the scope of the present disclosure. Although the present disclosure is described in details with reference to the above embodiments, however, one skilled in the art may make any modification or equivalence based on the technical solution and the inventive concept of the present disclosure. All these modifications and equivalences shall all be covered within the protection claimed in the claims of the present disclosure.

What is claimed is:

1. A middle frame assembly, comprising
    a middle frame, comprising a first surface and a second surface opposite to the first surface and defining a first through hole and a second through hole spaced apart from the first through hole, wherein both the first through hole and the second through hole penetrate the first surface and the second surface; and
    a bearing plate, comprising:
        a bearing body having a third surface;
        a first extending portion extending from the third surface and configured to pass through the first through hole and have an interference fit with the middle frame; and
        a second extending portion extending from the third surface, spaced apart from the first extending portion and configured to pass through the second through hole and have a clearance fit with the middle frame.

2. The middle frame assembly according to claim 1, wherein a first connecting medium is disposed between the first extending portion and the middle frame to connect the first extending portion and the middle frame together;
    a clearance is defined between the second extending portion and the middle frame, the clearance is filled with a second connecting medium to connect the second extending portion and the middle frame together.

3. The middle frame assembly according to claim 1, wherein a first slot is defined by the bearing body at the connection between the bearing body and the first extending portion, the first slot is configured to contain a portion of the first extending portion after the first extending portion is stamped to deform, such that the first surface and the third surface contact with each other.

4. The middle frame assembly according to claim 3, wherein a second slot surrounding the second extending portion is defined by the bearing body at the connection between the bearing body and the second extending portion; a volume of the first slot is larger than a volume of the second slot.

5. The middle frame assembly according to claim 1, wherein both the middle frame and the bearing body are plastically deformable;
a plastic-deformation degree of the middle frame is larger than a plastic deformation degree of the bearing body.

6. The middle frame assembly according to claim 1, wherein the first extending portion is plastically deformable.

7. The middle frame assembly according to claim 1, wherein the first extending portion comprises a first end surface away from the third surface, the first end surface is flush with the second surface;
the second extending portion comprises a second end surface away from the third surface, and the second end surface is flush with the second surface.

8. The middle frame assembly according to claim 1, wherein the first surface and the third surface abut against each other.

9. The middle frame assembly according to claim 1, wherein the bearing body has a fourth surface opposite to the third surface, both cross section area of a peripheral contour of the first extending portion and cross section area of a peripheral contour of the second extending portion gradually decrease from the third surface toward a direction away from the fourth surface.

10. A method for manufacturing a middle frame assembly, comprising:
providing a first structural member;
performing a machining operation on the first structural member to form a middle frame, wherein the middle frame defines a first through hole and a second through hole spacing apart from the first through hole, both the first through hole and the second through hole penetrate two opposing surfaces of the middle frame;
providing a second structural member;
performing a machining operation on the second structural member to form a bearing plate comprising a bearing body, a first extending portion and a second extending portion, wherein the first extending portion and the second extending portion extends from a same surface of the bearing body and spaced apart from each other; and
inserting the first extending portion into the first through hole and inserting the second extending portion into the second through hole, such that the first extending portion has an interference fit with the middle frame, and that the second extending portion has a clearance fit with the middle frame.

11. The method according to claim 10, wherein a clearance is defined between the second extending portion and the middle frame;
the method further comprises:
welding the first extending portion to the middle frame such that welding fluid surrounds the first extending portion, and welding the second extending portion to the middle frame such that at least part of welding fluid is filled in the clearance; and
cooling the welding fluid to form connecting medium to connect the middle frame and the bearing plate together.

12. The method according to claim 10, wherein the performing a machining operation on the second structural member to form a bearing plate comprising a bearing body, a first extending portion and a second extending portion further comprises: forming a first slot at the connection between the bearing body and the first extending portion.

13. The method according to claim 12, further comprises:
forming a second slot surrounding the second extending portion at the connection between the bearing body and the second extending portion, a volume of the first slot is larger than a volume of the second slot.

14. The method according to claim 13, wherein after the inserting the first extending portion into the first through hole and inserting the second extending portion into the second through hole, the method further comprises:
stamping the first extending portion to deform, such that the deformed first extending portion covers at least part of the middle frame and that a portion of the deformed first extending portion is contained in the first slot.

15. The method according to claim 10, wherein before the inserting the first extending portion into the first through hole and inserting the second extending portion into the second through hole, the method further comprises:
performing a smoothing process of a first precision on a surface of the first extending portion, and performing a smoothing process of a second precision on a surface of the second extending portion, wherein the first precision is larger than the second precision.

16. The method according to claim 10, wherein before the inserting the first extending portion into the first through hole and inserting the second extending portion into the second through hole, the method further comprises:
performing a smoothing process of a third precision on an inner surface of the first through hole, and performing a smoothing process of a fourth precision on an inner surface of the second through hole, wherein the third precision is larger than the fourth precision.

17. An electronic apparatus, comprising:
a back shell;
a middle frame assembly, connected to the back shell and defining at least one first through hole and at least one second through hole; and
a bearing plate comprising:
a bearing body having a third surface; and
at least one first extending portion and at least one second extending portion extending from the third surface and spaced apart from each other, wherein the at least one first extending portion is inserted into the at least one first through hole and has an interference fit with the middle frame, the at least one second extending portion is inserted into the at least one second through hole and has a clearance fit with the middle frame.

18. The electronic apparatus according to claim 17, wherein a first connecting medium is disposed between the at least one first extending portion and the middle frame to connect the at least one first extending portion and the middle frame together;
a clearance is defined between the at least one second extending portion and the middle frame, and the clearance is filled with a second connecting medium to connect the at least one second extending portion and the middle frame together.

19. The electronic apparatus according to claim 17, wherein at least one first slot is defined by the bearing body at the connection between the bearing body and the at least one first extending portion, the at least one first slot is configured to contain a portion of the first extending portion after the first extending portion is stamped to deform, such that the first surface and the third surface contact with each other;
at least one second slot surrounding the at least one second extending portion is defined by the bearing body at the connection between the bearing body and the at least one second extending portion; a volume of the at least one first slot is larger than a volume of the at least one second slot.

20. The electronic apparatus according to claim 17, wherein the at least one first extending portion comprises a first end surface away from the third surface, the first end surface is flush with the second surface;

the at least one second extending portion comprises a second end surface away from the third surface, the second end surface is flush with the second surface.

* * * * *